US011926483B2

(12) United States Patent
Kono et al.

(10) Patent No.: US 11,926,483 B2
(45) Date of Patent: Mar. 12, 2024

(54) ARTICLE TRANSPORT FACILITY, TRANSPORT VEHICLE ARRANGING METHOD, AND TRANSPORT VEHICLE ARRANGING PROGRAM

(71) Applicant: Daifuku Co., Ltd., Osaka (JP)

(72) Inventors: Makoto Kono, Komaki (JP); Keisuke Takeno, Komaki (JP); Kazuhiro Iwamitsu, Komaki (JP)

(73) Assignee: Daifuku Co., Ltd., Osaka (JP)

( * ) Notice: Subject to any disclaimer, the term of this patent is extended or adjusted under 35 U.S.C. 154(b) by 85 days.

(21) Appl. No.: 17/726,779

(22) Filed: Apr. 22, 2022

(65) Prior Publication Data

US 2022/0340370 A1    Oct. 27, 2022

(30) Foreign Application Priority Data

Apr. 23, 2021  (JP) .................................. 2021-073569

(51) Int. Cl.
*B65G 43/08*    (2006.01)

(52) U.S. Cl.
CPC ...... *B65G 43/08* (2013.01); *B65G 2203/0241* (2013.01); *B65G 2203/0258* (2013.01)

(58) Field of Classification Search
CPC ............ B65G 43/08; B65G 2203/0241; B65G 2203/0258
USPC ..................................................... 198/460.1
See application file for complete search history.

(56) References Cited

U.S. PATENT DOCUMENTS

| | | | |
|---|---|---|---|
| 6,591,961 B2 | 7/2003 | Fukushima | |
| 10,037,689 B2 * | 7/2018 | Taylor | G05D 1/0285 |
| 11,114,323 B2 | 9/2021 | Ogawa et al. | |
| 11,845,110 B2 * | 12/2023 | Lapointe | B65G 47/252 |
| 2002/0033319 A1 | 3/2002 | Fukushima | |
| 2019/0122910 A1 | 4/2019 | Ogawa et al. | |
| 2023/0339681 A1 * | 10/2023 | Stadie | A01G 31/06 |
| 2023/0391558 A1 * | 12/2023 | Bretz | B65G 43/08 |

FOREIGN PATENT DOCUMENTS

| | | |
|---|---|---|
| JP | 1039929 A | 2/1998 |
| JP | 200296725 A | 4/2002 |
| JP | 2004227059 A | 8/2004 |
| JP | 201980411 A | 5/2019 |

OTHER PUBLICATIONS

JP10039929 A, Igari et al, Clarivate (text only) (Year: 1998).*

* cited by examiner

*Primary Examiner* — Gene O Crawford
*Assistant Examiner* — Lester Rushin, III
(74) *Attorney, Agent, or Firm* — The Webb Law Firm

(57) ABSTRACT

Article transport vehicles have, as operation states, a first state of traveling toward a transport destination that is a destination set for receiving an article or delivering an article, and a second state in which a transport destination has not been set. A controller divides the entirety of a travelable route into a plurality of set areas and executes imbalance reduction control to arrange standby transport vehicles such that imbalance of the densities of standby transport vehicles present in the areas is within a predetermined range, the standby transport vehicles being article transport vehicles in the second state.

10 Claims, 10 Drawing Sheets

ARTICLE TRANSPORT FACILITY, TRANSPORT VEHICLE ARRANGING METHOD, AND TRANSPORT VEHICLE ARRANGING PROGRAM

CROSS-REFERENCE TO RELATED APPLICATION

This application claims priority to Japanese Patent Application No. 2021-073569 filed Apr. 23, 2021, the disclosure of which is hereby incorporated by reference in its entirety.

BACKGROUND OF THE INVENTION

1. Field of the Invention

The present invention relates to an article transport facility provided with article transport vehicles that travel along a specified travelable route and transport articles and a controller for controlling the article transport vehicles, and also relates to a transport vehicle arranging method and a transport vehicle arranging program for transport vehicle arrangement in the article transport facility.

2. Description of the Related Art

JP 2019-080411A discloses a known example of such an article transport facility. The controller of this article transport facility sets a set route, which is a route for traveling of an article transport vehicle from the current position to a destination on a travelable route, and arranges transport vehicles in the article transport facility. When setting the set route, there may be a plurality of candidate routes that are candidates for the set route from the current position of an article transport vehicle to the destination. In such a case, the set route that is set by the controller in route setting control is the candidate route that has the shortest route length or the candidate route that reaches the destination in the shortest time among a plurality of candidate routes. For example, even if a certain route has a short route length, if many article transport vehicles are arranged in that route, traveling at the maximum speed may be restricted, slow traveling may be required, or congestion may occur, and it is preferable that the controller sets an optimum set route based on the arrangement situation of other article transport vehicles as well.

SUMMARY OF THE INVENTION

Note that not all of the article transport vehicles that are present on the travelable route are always performing article transport (including transport when going to pick up an article), and there are article transport vehicles on the travelable route that have finished delivering an article, as well as article transport vehicles that are waiting for the next transport command. If such an article transport vehicle is located on a candidate route, the article transport vehicle may hinder the traveling of an article transport vehicle that is transporting an article. In particular, if many of such article transport vehicles are gathered in the same area, congestion may occur, and the overall operating efficiency of the article transport facility may decrease.

In view of this, there is desire for the provision of a technique capable of reducing the likelihood that an article transport vehicle not assigned a purpose of receiving an article or delivering an article will interfere with the traveling of an article transport vehicle assigned such a purpose.

In view of the foregoing, an article transport facility according to an aspect of the present invention includes: a plurality of article transport vehicles configured to travel along a specified travelable route and transport articles; and a controller configured to control the article transport vehicles, wherein the article transport vehicles have, as operation states, a first state of traveling toward a transport destination that is a destination set for receiving an article or delivering an article, and a second state in which the transport destination has not been set, and the controller divides an entirety of the travelable route into a plurality of set areas and executes imbalance reduction control to arrange a standby transport vehicle such that imbalance of densities of standby transport vehicles present in the areas is within a predetermined range, the standby transport vehicles being article transport vehicles in the second state.

It is desirable that the standby transport vehicles travel so as not to interfere with the traveling of article transport vehicles that are in the first state and traveling toward a transport destination, but in an area where the density of standby transport vehicles is high, congestion is likely to occur due to the high density, and there is a possibility that article transport vehicles in the first state will not be able to travel smoothly. However, according to the above configuration, the densities of standby transport vehicles in the areas can be made relatively uniform. Accordingly, it is possible to avoid the appearance of an area where the density of standby transport vehicles is high, and it is possible to facilitate the smooth traveling of article transport vehicles in the first state. In other words, according to the above configuration, it is possible to provide a technique capable of reducing the likelihood that an article transport vehicle not assigned a purpose of receiving an article or delivering an article will interfere with the traveling of an article transport vehicle assigned such a purpose.

Various technical features of the article transport facility described above can also be applied to a transport vehicle arranging method or a transport vehicle arranging program in an article transport facility. The following illustrates a representative embodiment. For example, the method for transport vehicle arrangement in an article transport facility can include various steps that have the features of the article transport facility described above. Also, the transport vehicle arranging program can cause a controller, which is a computer, to realize various functions having the features of the article transport facility described above. As a matter of course, the transport vehicle arranging method and the transport vehicle arranging program can also achieve the operations and effects of the article transport facility described above. Furthermore, as a preferred aspect of the article transport facility, various additional features illustrated in the following description of embodiments can also be incorporated into the transport vehicle arranging method and the transport vehicle arranging program, and the method and the program can also achieve operations and effects that correspond to the additional features.

As one preferred aspect, a transport vehicle arranging method is for, in an article transport facility that includes a plurality of article transport vehicles that travel along a specified travelable route and transport articles and a controller that controls the article transport vehicles, arrangement of the article transport vehicles by the controller, the article transport vehicles having, as operation states, a first state of traveling toward a transport destination that is a destination set for receiving an article or delivering an article, and a second state of not being assigned a purpose of receiving an article or delivering an article, and imbalance reduction control executed by the controller including: a step of dividing an entirety of the travelable route into a plurality of set areas; and a step of arranging a standby transport vehicle such that imbalance of densities of standby transport vehicles present in the areas is within a predetermined range, the standby transport vehicles being article transport vehicles in the second state.

Also, as another preferred aspect, a transport vehicle arranging program is for, in an article transport facility that includes a plurality of article transport vehicles that travel along a specified travelable route and transport articles and a controller that controls the article transport vehicles, causing the controller to realize arrangement of the article transport vehicles, the article transport vehicles having, as operation states, a first state of traveling toward a transport destination that is a destination set for receiving an article or delivering an article, and a second state of not being assigned a purpose of receiving an article or delivering an article, and the program causing the controller to realize an imbalance reduction control function including: a function of dividing an entirety of the travelable route into a plurality of set areas; and a function of arranging a standby transport vehicle such that imbalance of densities of standby transport vehicles present in the areas is within a predetermined range, the standby transport vehicles being article transport vehicles in the second state.

Further features and advantages of an article transport facility as well as a transport vehicle arranging method and a transport vehicle arranging program for transport vehicle arrangement in the article transport facility will become apparent from the following description of exemplary and non-limiting embodiments given with reference to the drawings.

DESCRIPTION OF THE INVENTION

Figure 1:
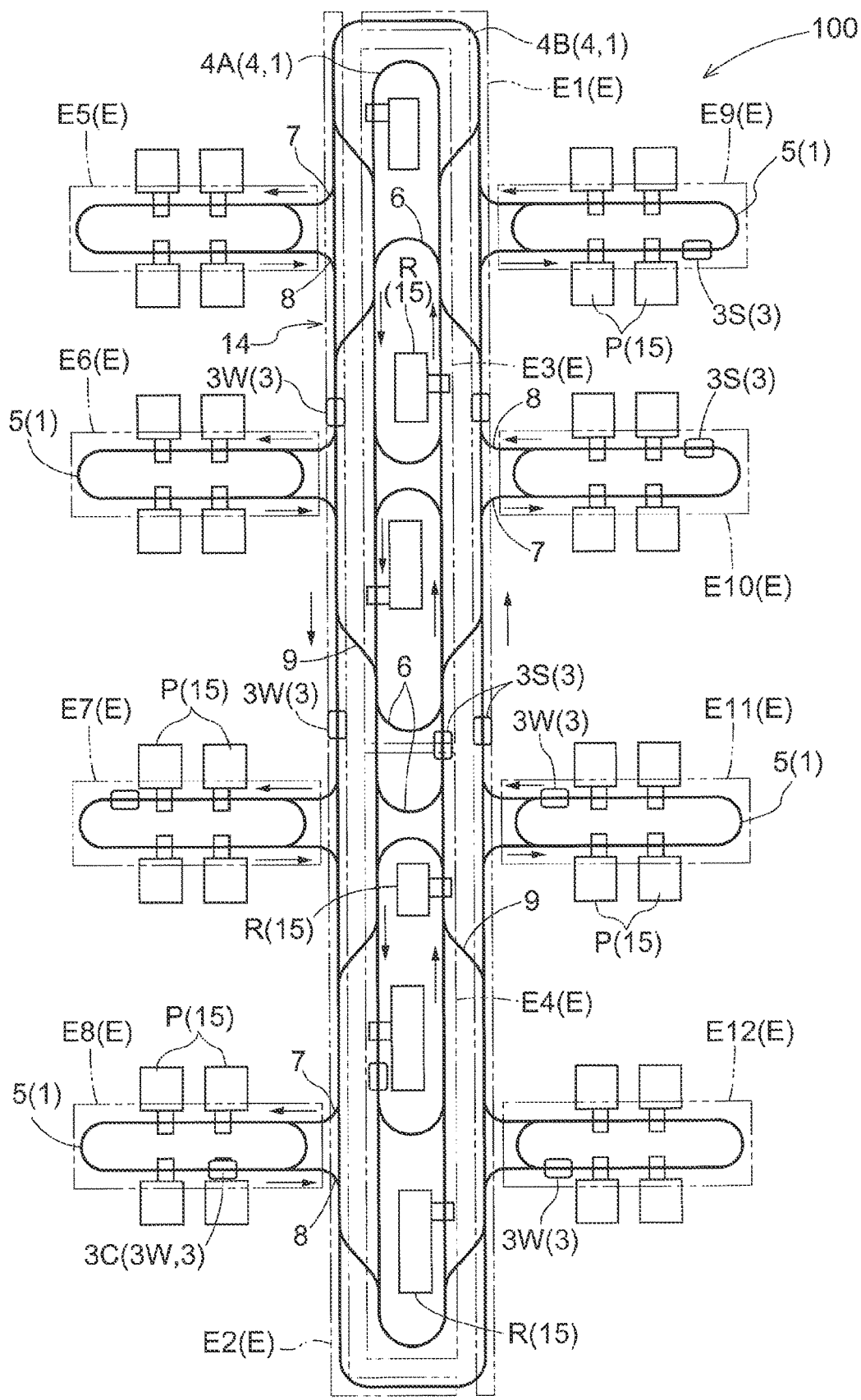
FIG. 1 is a plan view of an article transport facility.

Embodiments of an article transport facility as well as a transport vehicle arranging method and a transport vehicle arrangement for transport vehicle arrangement in the article transport facility will be described below with reference to the drawings. As shown in FIG. 1, the article transport facility includes article transport vehicles 3 that travel along a specified travelable route 1 and transport articles W, and a controller H that controls the article transport vehicles 3 (see FIG. 5). In the present embodiment, traveling rails 2 (see FIGS. 2 and 3) are disposed along the specified travelable route 1, a plurality of article transport vehicles 3 are provided, and the article transport vehicles 3 travel in one direction along the travelable route 1 on the traveling rails 2. As shown in FIG. 4, the traveling rails 2 are each constituted by a pair of left and right rail portions 2A. Note that in the present embodiment, the article transport vehicles 3 each transport an FOUP (Front Opening Unified Pod) that houses a semiconductor substrate serving as the article W.

As shown in FIG. 1, the travelable route 1 includes two main routes 4 and a plurality of sub-routes 5 that pass by a plurality of article processing apparatuses P. The two main routes 4 and the sub-routes 5 are each shaped as a loop. The two main routes 4 are provided in a concentric loop state. These two loop-shaped main routes 4 are routes on which the article transport vehicles 3 travel in the same direction (counterclockwise). In FIG. 1, the traveling directions of the article transport vehicles 3 are indicated by arrows.

Out of the two main routes 4, the inner main route 4 will be referred to as a first main route 4A, and the outer main route 4 will be referred to as a second main route 4B. The first main route 4A is set to pass by a plurality of storage units R. The first main route 4A is used as an article transfer route for stopping an article transport vehicle 3 in order to transfer an article W to or from a storage unit R. On the other hand, the second main route 4B is used as a continuous traveling route for allowing the article transport vehicles 3 to travel continuously.

The travelable route 1 includes shortcut routes 6, branch routes 7, merge routes 8, and transit routes 9. The shortcut routes 6 are each connected to each of a pair of parallel straight portions of the first main route 4A. The shortcut route 6 is a route for allowing an article transport vehicle 3 to travel from a first one of the pair of straight portions of the first main route 4A to the second straight portion, or from the second one to the first one. The branch routes 7 are each connected to the second main route 4B and a sub-route 5, and are routes for allowing the article transport vehicles 3 to travel from the second main route 4B to the sub-routes 5. The merge routes 8 are each connected to a sub-route 5 and the second main route 4B, and are routes for allowing the article transport vehicles 3 to travel from the sub-routes 5 to the second main route 4B. The transit routes 9 are each connected to the first main route 4A and the second main route 4B, and are routes for allowing the article transport vehicles 3 to travel from the first main route 4A to the second main route 4B or from the second main route 4B to the first main route 4A.

Figure 2:
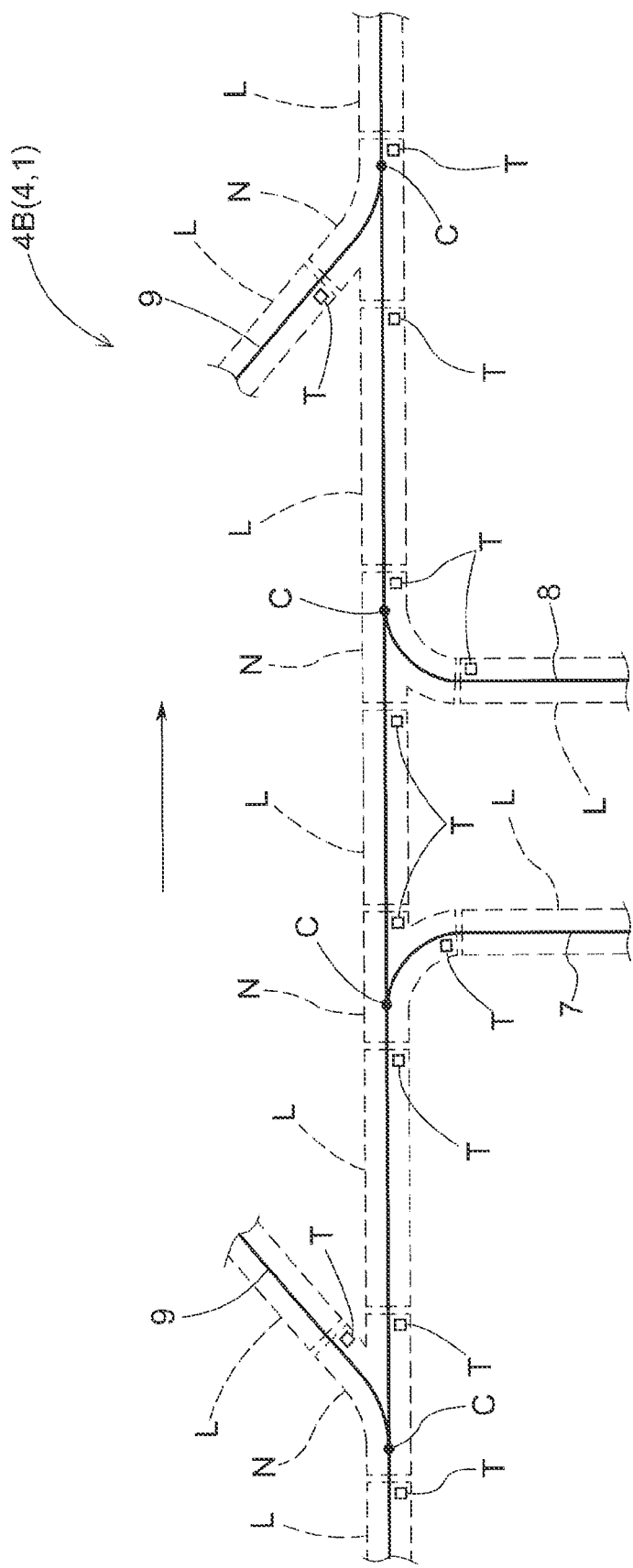
FIG. 2 shows nodes and links of a travelable route.

As shown in FIG. 2, the travelable route 1 includes a plurality of nodes N at which a route branches or routes merge, and a plurality of links L, which are each a route portion that connects a pair of nodes N. In the present embodiment, a node N is a route portion corresponding to a specified range extending upstream and downstream from a connection point C where a route branches or two routes merge. In the example of the portion of the second main route 4B shown in FIG. 2, in the case where the connection point C is the point where a transit route 9 branches from or merges with the second main route 4B, the node N corresponds to a specified range extending from the connection point C in the second main route 4B and the transit route 9. Also, in the case where the connection point C is the point where a branch route 7 branches from the second main route 4B, the node N corresponds to a specified range extending from the connection point C in the second main route 4B and the branch route 7. Also, in the case where the connection point C is the point where a merge route 8 merges with the second main route 4B, the node N corresponds to a specified range extending from the connection point C in the second main route 4B and the merge route 8. The link L is a route portion that is between a pair of nodes N in the second main route 4B and is connected to the pair of nodes N. In the present embodiment, the specified range extending from the connection point C is set based on the positions of a plurality of detection objects T disposed along the travelable route 1, as will be described later. In other words, the detection objects T are each disposed at a position corresponding to the boundary between a node N and a link L.

Figure 3:
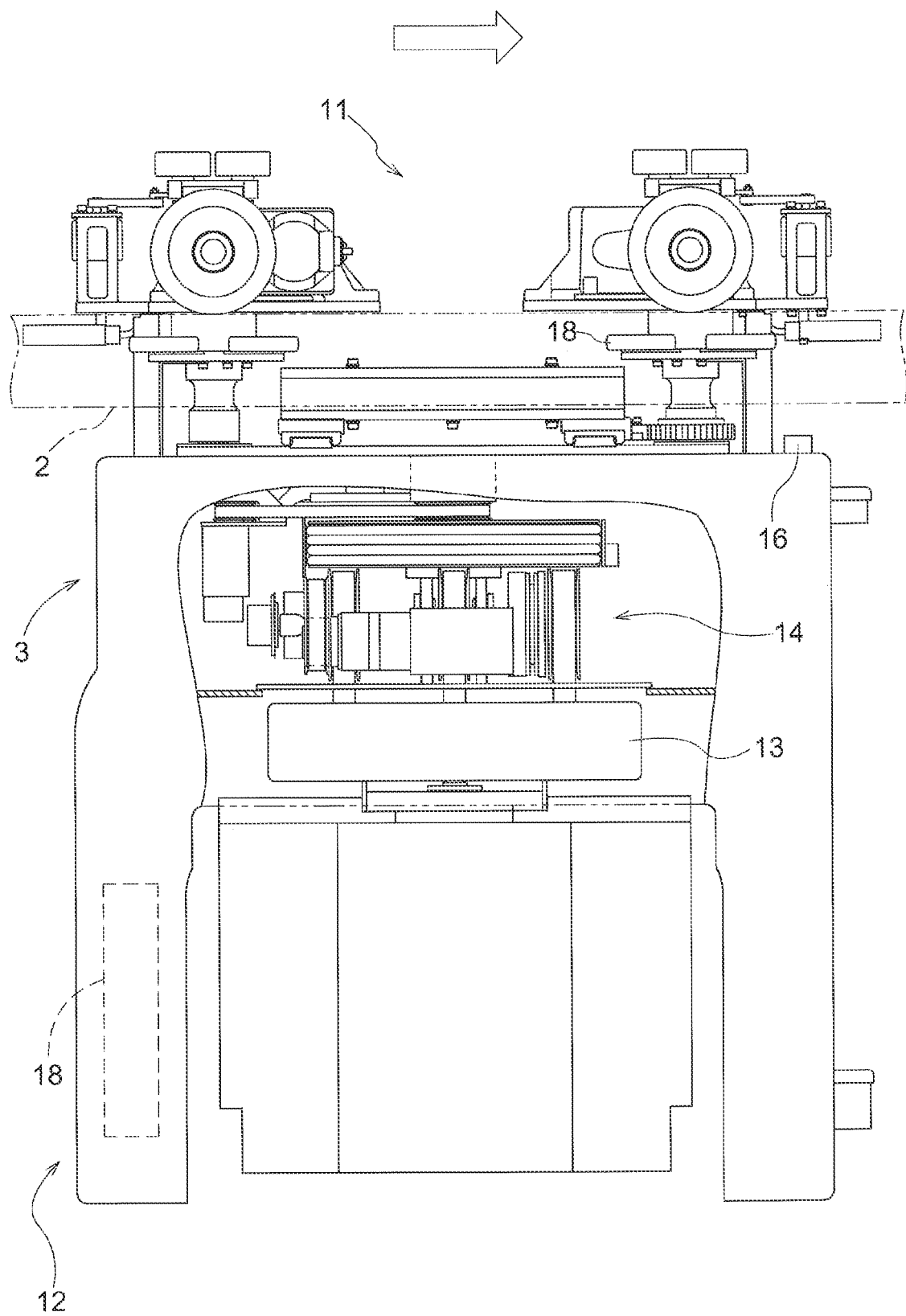
FIG. 3 is a side view of an article transport vehicle.
Figure 4:
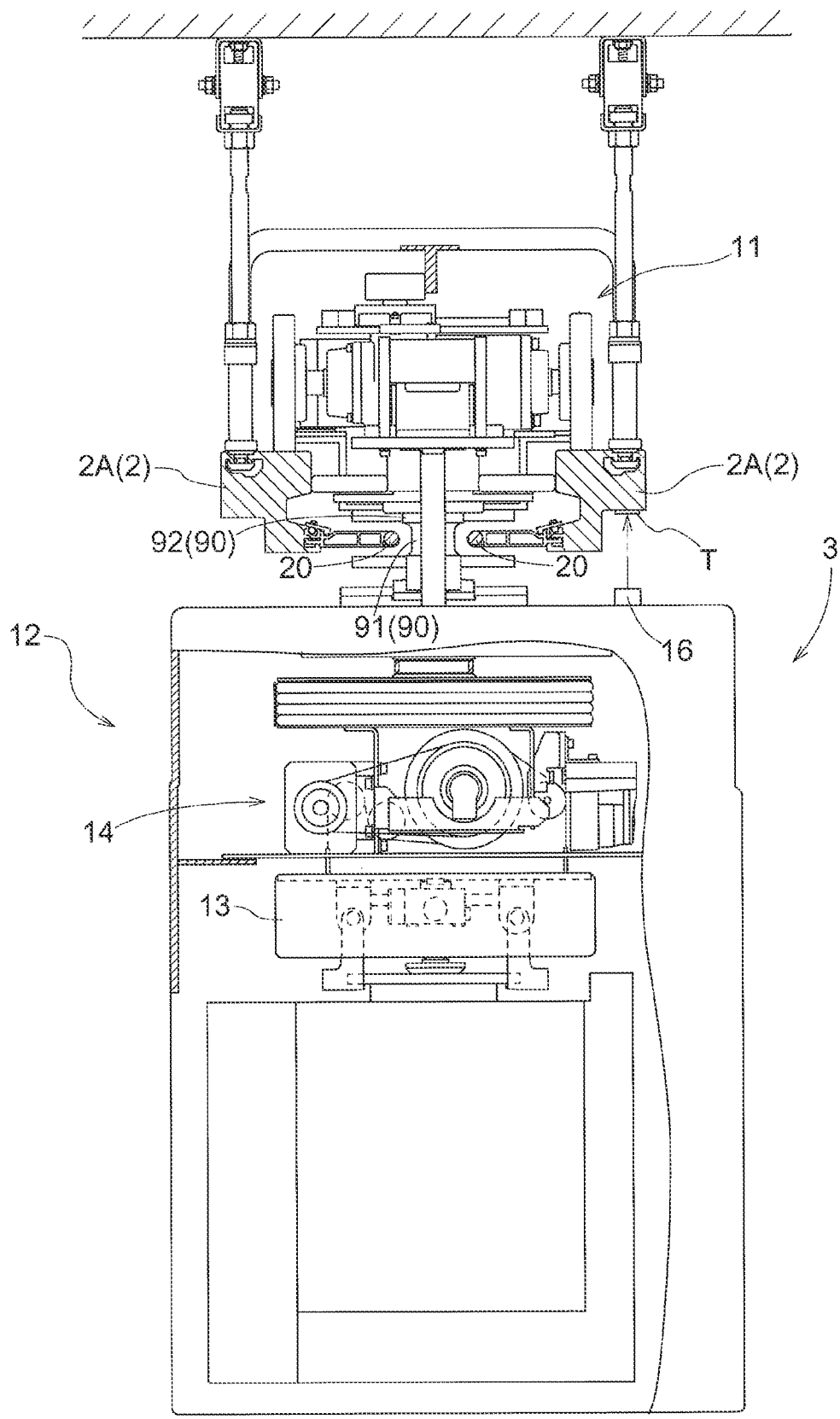
FIG. 4 is a front view of the article transport vehicle.

As shown in FIGS. 3 and 4, the article transport vehicle 3 includes a traveling portion 11 that travels along a traveling rail 2, which is suspended from and supported by the ceiling, at a position above the traveling rail 2, a main body portion 12 that is located below the traveling rail 2 and is suspended from and supported by the traveling portion 11, and a power receiving portion 90 for contactlessly receiving drive power supplied by power supply lines 20 disposed along the travelable route 1. The main body portion 12 includes a support mechanism 13 that supports an article W in a suspended state, and an elevating mechanism 14 that moves the support mechanism 13 in the vertical direction relative to the main body portion 12. In the case where an article processing apparatus P or a storage unit R is a transport-source transfer target location 15 (see FIG. 1), the article transport vehicle 3 travels to a position corresponding to the transport-source transfer target location 15, retrieves an article W at the transport-source transfer target location 15, and transfers the article W from that transfer target location 15 to the interior of the main body portion 12. Thereafter, the article transport vehicle 3 travels to a position corresponding to a transport-destination transfer target location 15, and transfers the article W supported by the support mechanism 13 from the interior of the main body portion 12 to the transport-destination transfer target location 15. As a result, the article W is transported from the transport-source transfer target location 15 to the transport-destination transfer target location 15. At this time, in the present embodiment, the article transport vehicle 3 travels at a first speed when traveling on a straight route, and travels at a second speed, which is lower than the first speed, when traveling on a curved route.

As shown in FIG. 4, the power supply lines 20 are respectively supported by the pair of rail portions 2A that constitute the traveling rail 2, and are arranged along the travelable route 1 (traveling rail 2). In the present embodiment, the power supply lines 20 extend in the horizontal direction and are arranged on both sides of the power receiving portion 90 in a direction orthogonal to the extending direction of the travelable route 1 (traveling rail 2). In the present embodiment, the power receiving portion 90 supplies drive power to the article transport vehicle 3 with use of a wireless power feeding technology called HID (High Efficiency Inductive Power Distribution Technology). Specifically, a high-frequency current is applied to the power supply lines 20, which are induction wires, and thus a magnetic field is generated around the power supply lines 20. The power receiving portion 90 includes a pickup coil 91, and an AC voltage is induced in the pickup coil 91 due to electromagnetic induction from the magnetic field. The power receiving portion 90 includes a power receiving circuit (not shown) that includes a full-wave rectifier circuit and a smoothing capacitor, and the induced AC voltage is rectified to a DC voltage.

Figure 5:
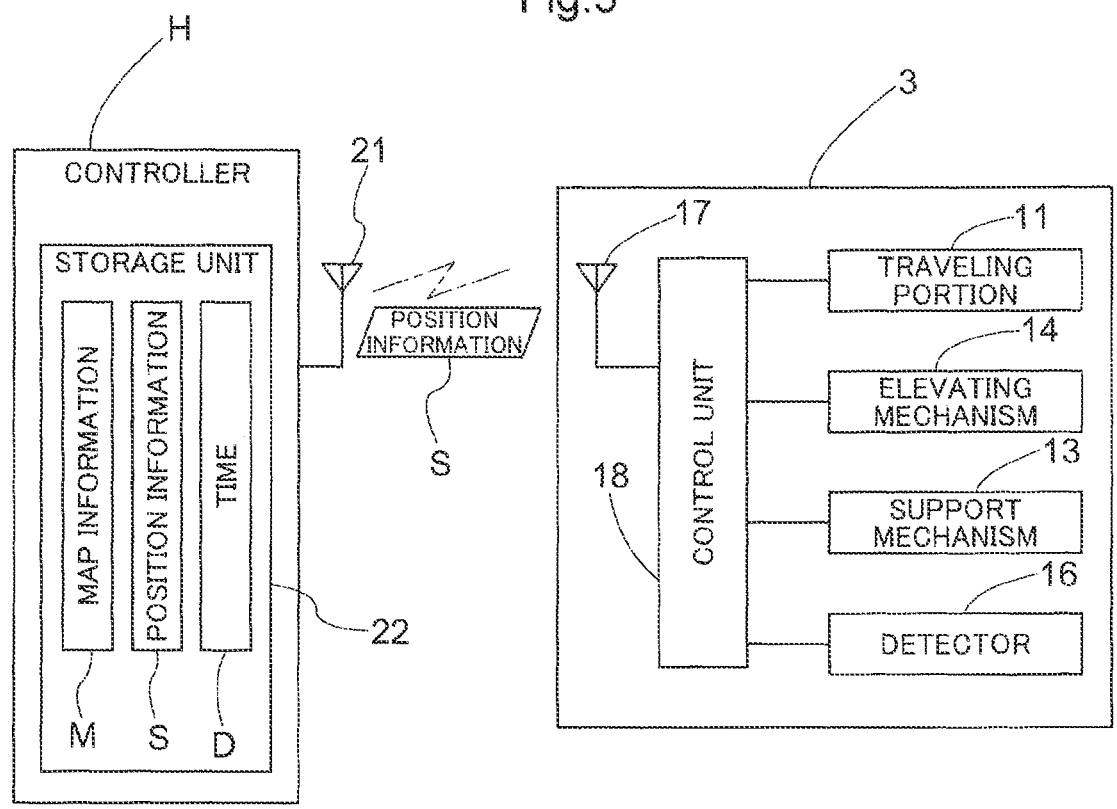
FIG. 5 is a control block diagram.

As shown in FIG. 5, the article transport vehicle 3 includes a detector 16, a transmission/reception device 17, and a control unit 18. The detector 16 detects detection objects T (see FIGS. 2 and 4) that are disposed along the travelable route 1. Each detection object T has position information indicating the position where the detection object T is disposed, and the detector 16 reads the position information of the detection object T. A plurality of detection objects T are disposed along the travelable route 1, and more specifically are disposed at connection points between nodes N and links L, positions corresponding to the transfer target locations 15, and the like. The transmission/reception device 17 reads the position information of a detection object T detected by the detector 16, and transmits the read position information S to a transmission/reception unit 21 of the controller H as necessary. Specifically, the article transport vehicle 3 transmits position information S to the controller H when entering a link L, exiting a link L, and reaching a position corresponding to a transfer target location 15. The position information S transmitted by the article transport vehicle 3 to the controller H corresponds to position information S that indicates the position of that article transport vehicle 3. Also, the article transport vehicles 3 each transmit position information S indicating their position to the controller H. The transmission/reception device 17 also receives information transmitted by the transmission/reception unit 21 of the controller H.

The controller H includes a storage unit 22 that stores map information M regarding the travelable route 1, which is information regarding the links L and the nodes N that make up the travelable route 1 as described above. The storage unit 22 also stores the position information S received from the article transport vehicles 3 in association with a corresponding time D. In the present embodiment, the controller H stores the time D when position information S is received from the transmission/reception device 17 of an article transport vehicle 3, in association with the position information S. Note that if the article transport vehicles 3 are configured to transmit time information that indicates the time D when the position information S of the detection object T was read, to the controller H together with the position information S, the controller H may store the time D shown in that time information in the storage unit 22 in association with the position information S. The controller H acquires number of vehicles information based on the positions of the article transport vehicles 3 at respective time points, which are obtained based on the information stored in the storage unit 22. The controller H can acquire the position of each of the article transport vehicles 3 on the travelable route 1 based on the position information S received from the article transport vehicles 3.

For example, in the time period from reception of position information S that is transmitted when an article transport vehicle 3 enters a link L (or exits the node N upstream of that link L) until reception of position information S that is transmitted when the article transport vehicle 3 exits that link L, the controller H can determine that the article transport vehicle 3 is present in the link L whose entrance corresponds to the received position information S. Also, in the case where a transfer target location 15 is located in a link L, if position information S transmitted upon arrival at the transfer target location 15 has not been received from an article transport vehicle 3 determined to be present in the link L, it can be determined that the article transport vehicle

3 is located upstream of the transfer target location 15 in the link L, and if the position information S has been received, it can be determined that the article transport vehicle 3 is located at the transfer target location 15 or downstream thereof in the link L. In this way, the controller H acquires the number of article transport vehicles 3 located in each of the links L based on the positions of the plurality of article transport vehicles 3 at respective time points. At this time, in the case of a link L that includes a transfer target location 15, the controller H acquires the number of article transport vehicles 3 located upstream of the transfer target location 15 in the link L and the number of article transport vehicles 3 located downstream of the transfer target location 15 in the link L.

As described above, the controller H stores the map information M in the storage unit 22. The map information M includes basic map information, which includes information indicating the positions and connection relationships of the links L and the nodes N along the travelable route 1, attribute information indicating attributes of the links L and the nodes N, and information indicating the shapes of the links L and the shapes of the nodes N. The map information also includes travel control information in which various types of information necessary for traveling of the article transport vehicles 3, such as position information S for a plurality of points on the travelable route 1, is associated with the basic map information.

Figure 6:
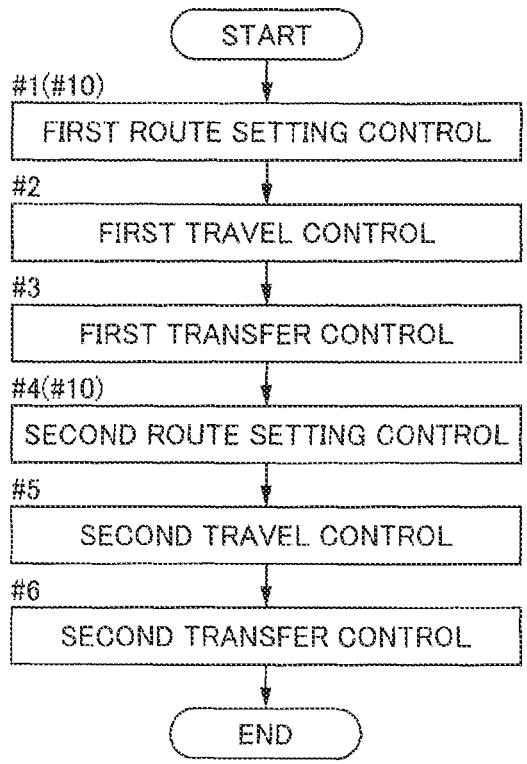
FIG. 6 is a flowchart of transport control.

In the case of transporting an article W from a transport source to a transport destination, as shown in the flowchart of transport control in FIG. 6, the controller H sequentially executes: first route setting control #1 for setting a first set route for causing an article transport vehicle 3 to travel from a current position to a position (destination) corresponding to a transport-source transfer target location 15 based on the basic map information; first travel control #2 for causing the article transport vehicle 3 to travel along the first set route and reach a position corresponding to the transport-source transfer target location 15; first transfer control #3 for transferring the article W at the transport-source transfer target location 15 to the main body portion 12; second route setting control #4 for setting a second set route for causing the article transport vehicle 3 to travel from the current position to a position (destination) corresponding to a transport-destination transfer target location 15 based on the basic map information; second travel control #5 for causing the article transport vehicle 3 to travel along the second set route and reach a position corresponding to the transport-destination transfer target location 15; and second transfer control #6 for transferring the article W in the main body portion 12 to the transport-destination transfer target location 15.

The first route setting control #1 and the second route setting control #4 are similar types of control, and will be simply referred to as route setting control #10 when there is no need to distinguish between them. In other words, the route setting control #10 includes the first route setting control #1 and the second route setting control #4. Therefore, a set route 1A includes the first set route and the second set route described above.

Figure 8:
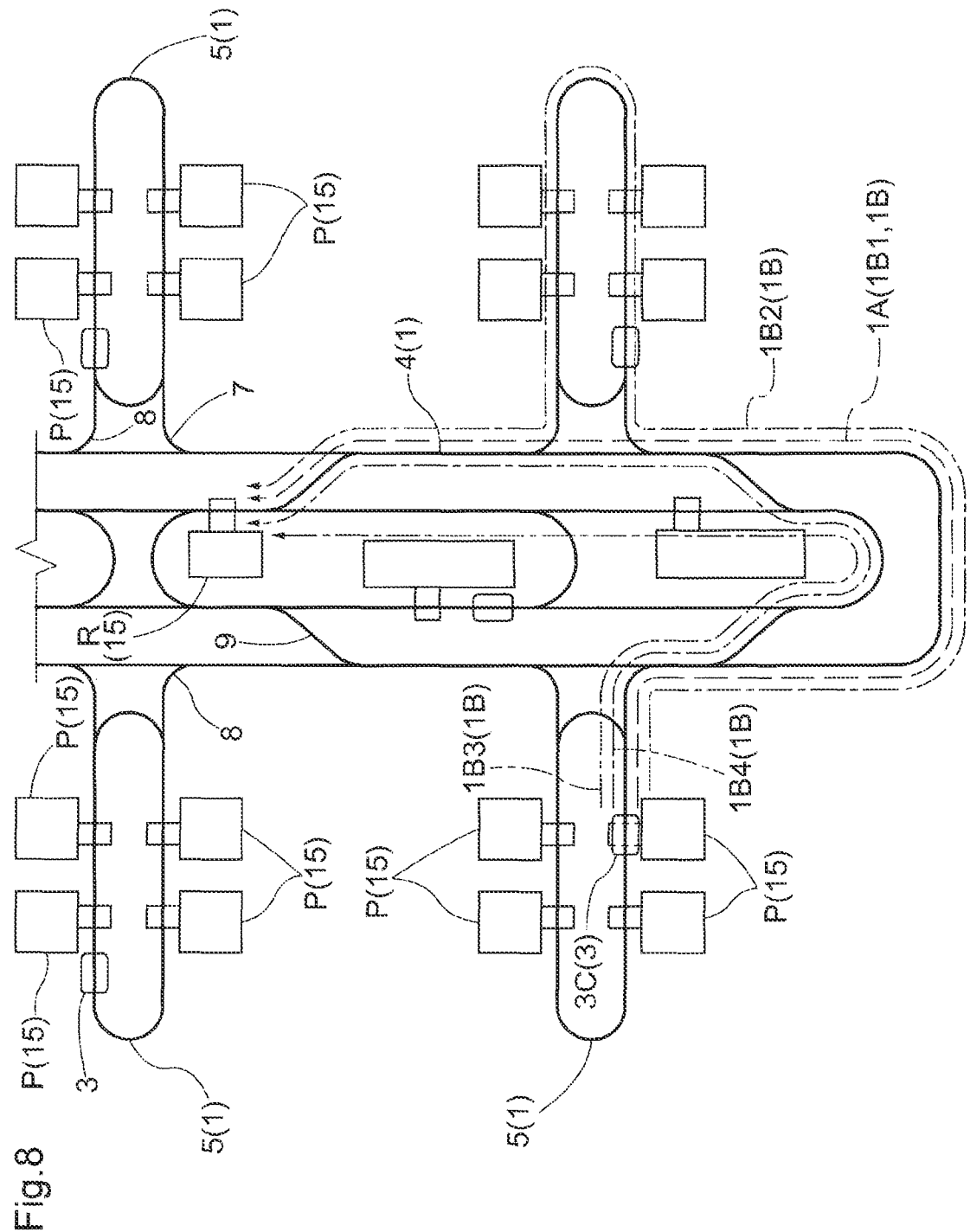
FIG. 8 is a diagram showing an example of a set route and candidate routes for an article transport vehicle.

As shown in FIG. 8, there can be multiple routes from the current position to a destination. In other words, there are a plurality of candidate routes 1B that are candidates for the set route 1A. FIG. 8 illustrates four candidate routes 1B, namely a first candidate route 1B1, a second candidate route 1B2, a third candidate route 1B3, and a fourth candidate route 1B4. If a plurality of candidate routes 1B exist, the controller H determines one set route 1A from among the candidate routes 1B. In the example shown in FIG. 8, the first candidate route 1B1 has been set as the set route 1A.

The controller H executes the route setting control #10 for setting the set route 1A (e.g., the first candidate route 1B1 indicated by dashed lines in FIG. 8) for causing the article transport vehicle 3 to travel from the current position to a destination on the travelable route 1, based on link costs LC set for the links L. The link costs LC each include a reference cost ST, which is a static (fixed) cost, and a variable cost DY, which is a dynamic cost, and the link cost LC is calculated using the following expression (1). The link cost LC will be described later.

$$LC=ST+DY \quad (1)$$

Figure 7:
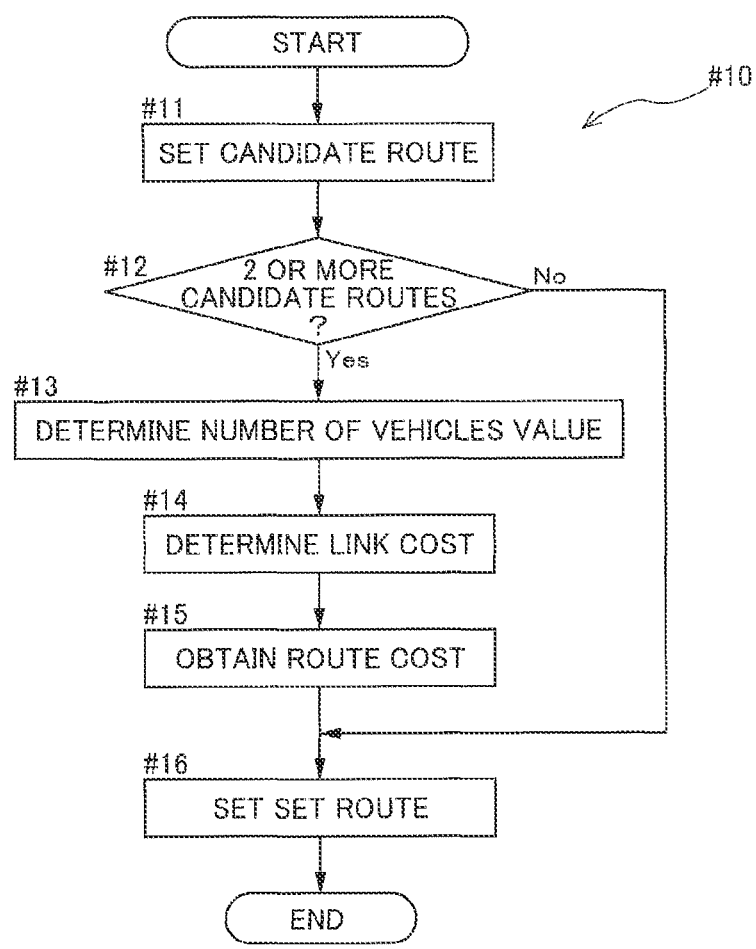
FIG. 7 is a flowchart of route setting control.

In the present embodiment, as shown in the flowchart of the route setting control #10 in FIG. 7, based on current position information of a setting vehicle 3C, destination information, and the map information, the controller H sets one or more candidate routes 1B as routes that enable traveling from the current position to the destination (#11). Next, the controller H determines whether or not two or more set candidate routes 1B were set (#12). If only one candidate route 1B was set, the controller H sets the candidate route 1B as the set route 1A (#15). If two or more candidate routes 1B were set, the controller H first determines a number of vehicles value n for each of all of the links L that belong to the candidate routes 1B (#13). The method for determining the number of vehicles value n will be described later. Next, the controller H determines the link cost LC for each of all of the links L that belong to the candidate routes 1B based on the reference cost ST and the variable cost DY that corresponds to the number of vehicles value n (#14). Then, for each of the candidate routes 1B, the controller H obtains a route cost TC, which is the total cost of the candidate route 1B, based on the link costs LC of the links L that belong to the candidate route 1B (#15), and sets one set route 1A from among the two or more candidate routes 1B based on the route costs TC of the candidate routes 1B (#16).

The controller H repeatedly executes the route setting control #10 at least at a regular time interval. As the setting vehicle 3C approaches a target link LA, the actual influence of other vehicles 3B approaches the actual state. For this reason, if the route setting control #10 is repeatedly executed at a regular time interval, the route setting can be reviewed while the setting vehicle 3C is moving, and the route setting can be performed more precisely based on the influence of other vehicles 3B.

The following describes the link cost LC and the number of vehicles value n. Here, the setting vehicle 3C is defined as the article transport vehicle 3 for which the set route 1A is to be set in the route setting control #10. Also, the target vehicle 3A is defined as an article transport vehicle 3 that passes through a link L on the candidate route 1B of the setting vehicle 3C, and the target link LA is defined as the link L through which the target vehicle 3A passes. Also, the other vehicle 3B is defined as an article transport vehicle 3 other than the target vehicle 3A.

Figure 9:
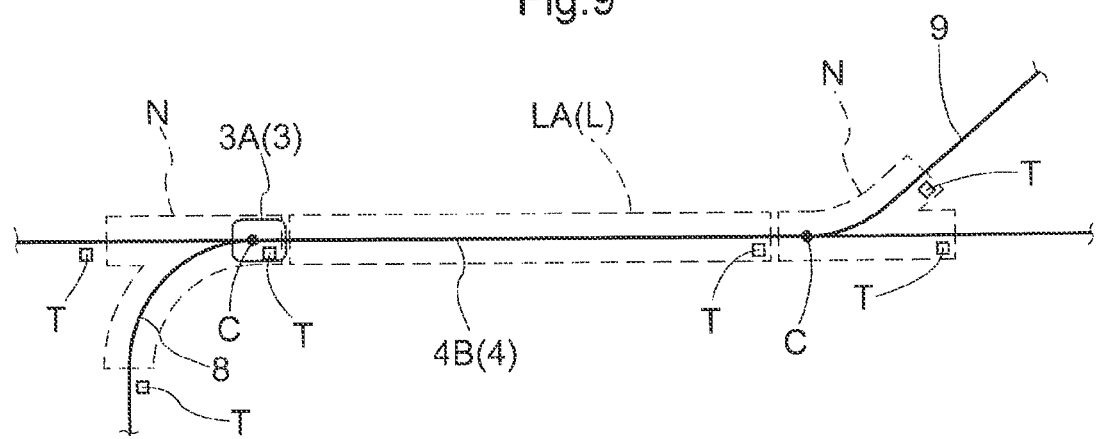
FIG. 9 is a diagram showing a state in which a target vehicle enters a target link in an empty traveling state.
Figure 10:
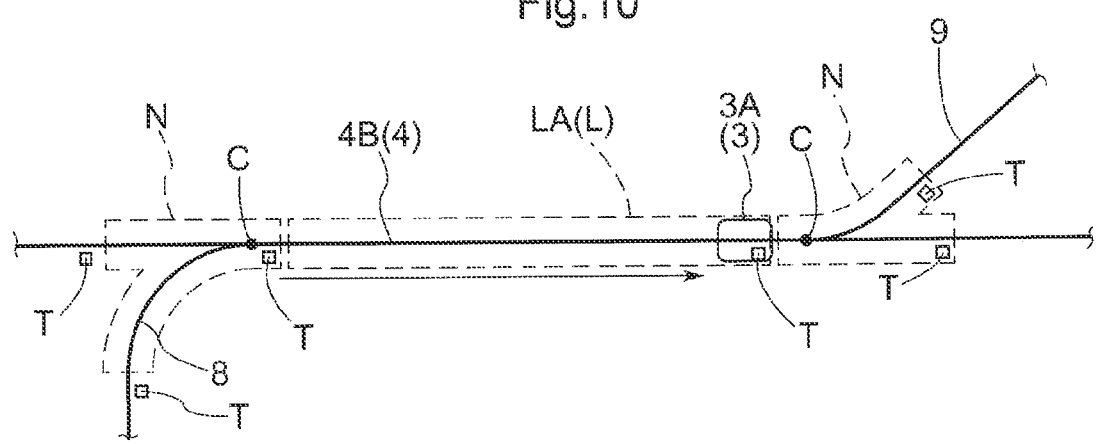
FIG. 10 is a diagram showing a state in which a target vehicle exits from a target link in an empty traveling state.
Figure 11:
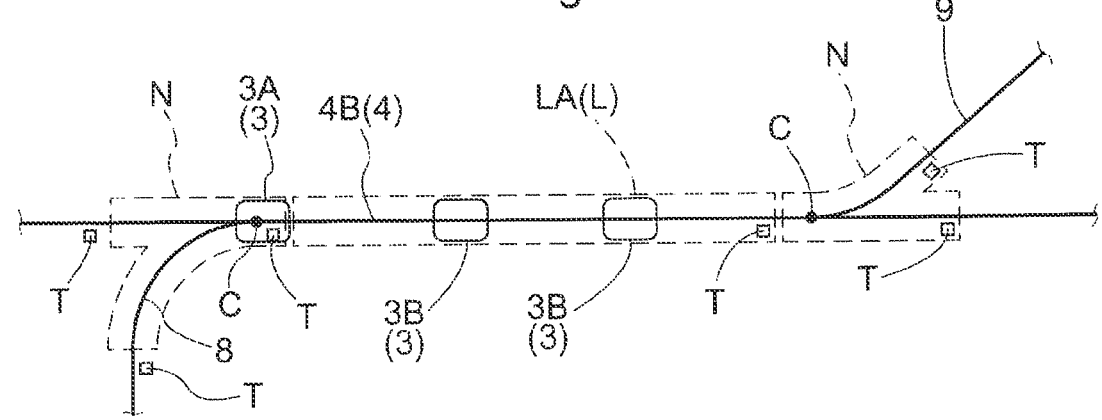
FIG. 11 is a diagram showing a state in which a target vehicle enters a target link in an actual running state.
Figure 12:
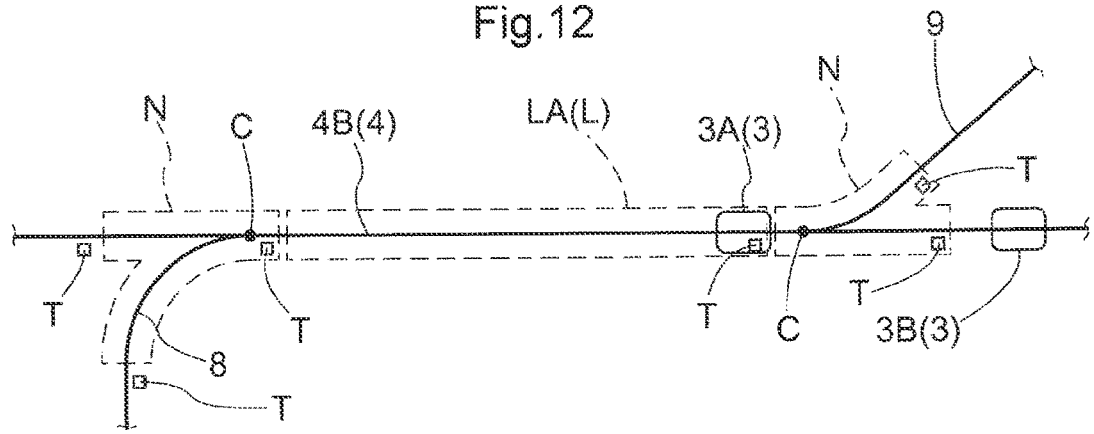
FIG. 12 is a diagram showing a state in which a target vehicle exits from a target link in an actual running state.

The reference cost ST for each link L is a value set based on a reference transit time, which is the time required for the target vehicle 3A to pass through the target link LA when another vehicle 3B is not present in the target link LA. In the present embodiment, as shown in FIG. 9, upon receiving position information S transmitted by a target vehicle 3A entering a target link LA in an empty traveling state in which no other vehicle 3B is present in the target link LA, the controller H calculates the reference transit time based on the time D of reception of position information S transmitted by the target vehicle 3A entering the target link LA and the time D of reception of position information S transmitted by the target vehicle 3A exiting the target link LA as shown in FIG. 10. The controller H sets the reference cost ST based on this reference transit time. For example, the reference cost ST can be the number of seconds making up the reference transit time.

The variable cost DY is a value that corresponds to the transit time (actual transit time) in an actual traveling state in which the target vehicle 3A travels through the target link LA while another vehicle 3B is present in the target link LA, and is a value that changes according to the number of other vehicles 3B. The larger the number of other vehicles 3B present in the target link LA is, the longer the actual transit time is. Here, this transit time, which increases each time the number of other vehicles 3B present in the target link LA increases, will be referred to as the "time increase per vehicle ΔTn". The variable cost DY is a value set based on the amount of time that the actual transit time, which is the time required for the target vehicle 3A to travel through the target link LA in the actual traveling state in which the target vehicle 3A travels through the target link LA while another vehicle 3B is present in the target link LA, increases relative to the reference transit time in accordance with the number of other vehicles 3B present in the target link LA (time increase per vehicle ΔTn (amount of increase in actual transit time)).

Here, in order to improve the accuracy as an index of the variable cost DY, the controller H causes the target vehicle 3A to travel through the target link LA a plurality of times in a state where another vehicle 3B is present in the target link LA, acquires the actual transit time and the number of vehicles information indicating the number of other vehicles 3B present in the target link LA for each of the times, and obtains the time increase per vehicle ΔTn based on the correlation between the number of vehicles information and the amount of increase in the actual transit time relative to the actual transit time. Specifically, the controller H sets, as the time increase per vehicle ΔTn, the amount of increase in the actual transit time per other vehicle, which is obtained by dividing the amount of increase in the actual transit time relative to the reference transit time by the number of vehicles indicated by the number of vehicles information. The average value of the time increase per vehicles ΔTn obtained by causing the target vehicle 3A to travel through the target link LA a plurality of times is set as the final time increase per vehicle ΔTn.

In the route setting control, the controller H determines the number of vehicles value n, which is the number of other vehicles 3B considered to be present in the target link LA, and sets the variable cost DY for the target link LA according to the number of vehicles value n. The controller H can set the variable cost DY to a value obtained by multiplying the number of vehicles value n for the target link LA by the time increase per vehicle ΔTn (amount of increase in actual transit time per other vehicle) for the target link LA obtained as described above. In other words, the variable cost DY can be set to the number of seconds obtained by multiplying the time increase per vehicle ΔTn by the number of vehicles value n, as shown in the following expression (2).

$$DY = \Delta Tn \cdot n \tag{2}$$

For example, if the number of vehicles value n of the target link LA is 4 and the time increase per vehicle ΔTn is 5 seconds, 20 is set as the variable cost DY. In this way, the variable cost DY is an index showing the amount of increase in the actual transit time of the target link LA, which is expected to increase as the number of other vehicles 3B considered to be present in the target link LA increases. When executing the route setting control, the controller H sets the variable cost DY for all of the links L belonging to the candidate route 1B that are candidates for the set route 1A from the current position of the setting vehicle 3C to the destination.

Based on the variable cost DY and the reference cost ST set in this way, the controller H determines the link cost LC for each of the links L in the candidate route 1B, which is a candidate for the set route 1A from the current position of the setting vehicle 3C to the destination. The route cost TC, which is the total cost of the candidate route 1B, is obtained based on the link costs LC, and the set route 1A is set based on the route costs TC of the candidate route 1B.

The following describes a method for determining the number of vehicles value n. When the controller H determines the number of vehicles value n, other vehicles 3B determined to actually be present in the target link LA are deemed to be other vehicles that are present in the target link LA. The number of such other vehicles 3B is the current number of vehicles value na. Also, in the present embodiment, when the controller H determines the number of vehicles value n, another vehicle 3B for which the set route 1A passing through the target link LA has already been set is deemed to be another vehicle present in the target link LA regardless of the current position of the other vehicle 3B. Note that another vehicle 3B for which the set route 1A passing through the target link LA has already been set may also be another vehicle 3B for which the set route 1A having the target link LA as the destination has already been set. This number of other vehicles 3B is a future number of vehicles value nb. In other words, the number of vehicles value n is the sum of the current number of vehicles value na and the future number of vehicles value nb as shown in the following expression (3).

$$n = na + nb \tag{3}$$

Figure 13:
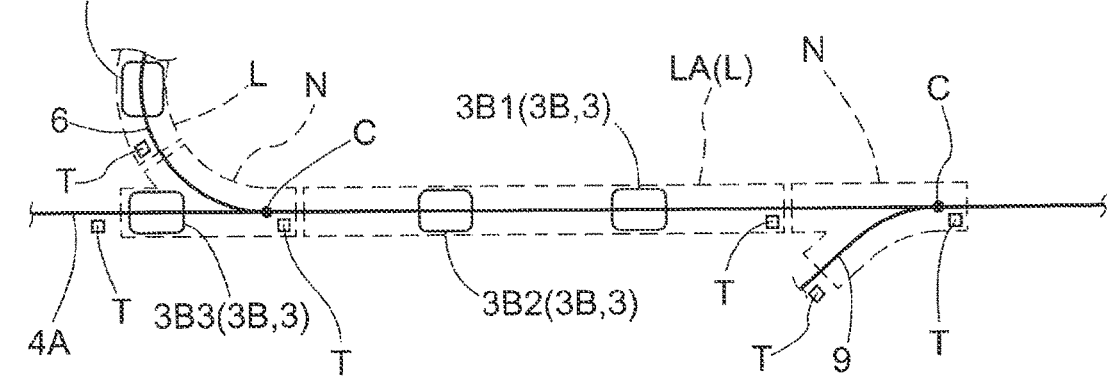
FIG. 13 is a diagram showing other vehicles considered to be present in the target link.

In other words, in the present embodiment, when the controller H determines the number of vehicles value n (4 in the example in FIG. 13), the other vehicles deemed to be present in the target link LA are the other vehicles 3B determined to be present in the target link LA when executing the route setting control #10 for the setting vehicle 3C (2 vehicles in the example shown in FIG. 13), as well as the other vehicles 3B that were determined to not be present in the target link LA when executing the route setting control #10 but are other vehicles 3B for which the target link LA has already been entirely or partially set as the set route 1A (two vehicles in the example shown in FIG. 13). In this way, the links L that belong to the candidate routes 1B are used as the target links LA, and the controller H determines the number of vehicles value n for each of target links LA.

By determining the number of vehicles value n in this way, the link cost LC of the target link LA can be determined based on not only the actual congestion level of the target link LA when route setting control is performed for the setting vehicle 3C (in the example shown in FIG. 13, there are two other vehicles 3B), but also the future congestion level of the target link LA. Specifically, even if another vehicle 3B is not present in the target link LA at the time of route setting control, if it is scheduled to pass through the target link LA, that other vehicle 3B can possibly be present in the target link LA before or after the setting vehicle 3C passes through the target link LA, and thus may increase the congestion level of the target link LA. Also, if there are many other vehicles 3B that are not present in the target link LA before or after the setting vehicle 3C passes through the target link LA but are scheduled to pass through the target link LA, the future congestion level of the target link LA is likely to be high. According to the configuration of the present embodiment, the link cost LC of the target link LA can be determined based on the future congestion level of the target link LA as well, and thus the set route 1A of the setting vehicle 3C is more likely to be set appropriately.

Note that the article transport vehicles 3 do not all have the same traveling purpose. For example, as described above with reference to FIG. 6, in the first travel control #2, an article transport vehicle 3 is caused to travel to a position corresponding to a transport-source transfer target location 15, and in the second travel control #5, an article transport vehicle 3 is caused to travel to a position corresponding to a transport-destination transfer target location 15.

Also, as described above, the article transport facility 100 includes a plurality of article processing apparatuses P and a plurality of storage units R. The article transport facility 100 of the present embodiment is a semiconductor manufacturing facility, for example, and the article processing apparatuses P are each a production device that performs various types of manufacturing processes on a semiconductor substrate, and is a place where transport target articles W are used. Also, the storage units R are each a storage unit for a semiconductor substrate serving as a material, or a storage unit for a semiconductor in the process of being manufactured (a semiconductor substrate subjected to processing in some steps), and is a storage location for transport target articles W. Therefore, the transport source can be an article processing apparatus P or a storage unit R, and the transport destination can also be an article processing apparatus P or a storage unit R.

When performing such transport, an article transport vehicle 3 travels toward a transport destination, which is a destination set for receiving an article W or delivering an article W. In the present embodiment, this traveling is referred to as "transport-related traveling". Also, in the present embodiment, the operating state of the article transport vehicle 3 in this case is defined as a "first state" of traveling toward a destination set for receiving an article W or delivering an article W. Also, an article transport vehicle 3 in the first state will be referred to as an "in-operation transport vehicle 3W" (see FIG. 1).

Note that the traveling purpose is not limited to the purpose of transporting an article W as described above, but rather also includes the purpose of traveling in order for an article transport vehicle 3 that has finished transporting an article W to move away from the transport destination, and the purpose of traveling in order for an article transport vehicle 3 that has finished transporting an article W to move to a location and wait for the next transport command. In the present embodiment, such traveling is referred to as "retreat traveling", "standby traveling", "non-transport-related traveling", or the like. It should be noted that standby traveling also includes a state in which an article transport vehicle 3 is stopped. From the viewpoint of another article transport vehicle 3 that is transporting an article W, this corresponds to evicting the article transport vehicle 3 that is not transporting an article W, and is also sometimes referred to as "eviction traveling". The operating state of such an article transport vehicle 3 in this case is defined as a "second state" in which a destination for receiving an article W or delivering an article W (i.e., a transport destination) has not been set. Note that even in the second state, a traveling destination is set, and here, such a destination will be referred to as a "non-transport destination". Also, an article transport vehicle 3 in the second state will be referred to as a "standby transport vehicle 3S" (see FIG. 1).

As described above, based on the route costs TC, the controller H sets, as the set route 1A, the candidate route having the shortest route length or the candidate route having the shortest time required to reach the destination, from among a plurality of candidate routes 1B. Even if a certain route has a short route length, if many article transport vehicles 3 are arranged in the route, traveling at the maximum speed may be restricted, slow traveling may be required, or congestion may occur. Therefore, as described above, the controller H sets the set route 1A based on the variable cost DY, which is based on the number of vehicles value n, as well.

However, even if the variable cost DY is taken into consideration, the route that is optimum at that time is simply selected. In other words, in the case where the travelable route 1 in the article transport facility 100 is not used efficiently, even if an optimum route is selected as the set route 1A, there is still room for improvement in the transport efficiency. For example, if a standby transport vehicle 3S is present on a link L included in a candidate route 1B, the traveling of an in-operation transport vehicle 3W that is transporting an article W may be hindered. In particular, if many standby transport vehicles 3S are gathered in the same area, the variable cost DY of a link L that passes through that area increases. In the case where a plurality of standby transport vehicles 3S are present in one or more links L included in the candidate route 1B that can possibly be the optimum route if the variable cost DY is small, there are cases where a route that bypasses the corresponding area is set as the set route 1A, and the transport efficiency decreases. Also, if a route that passes through such a region is set as the set route 1A, the actual transport time may become longer due to congestion or the like, and the transport efficiency may decrease.

In view of this, in the present embodiment, the arrangement of the article transport vehicles 3 is controlled so as to reduce the likelihood that an article transport vehicle 3 not assigned a purpose of receiving an article W or delivering an article W (i.e., a standby transport vehicle 3S) hinders the traveling of an article transport vehicle 3 assigned such a purpose (an in-operation transport vehicle 3W). Specifically, the controller H divides the entirety of the travelable route 1 into a plurality of areas E, and executes imbalance reduction control #50 for arranging standby transport vehicles 3S such that imbalance of the densities of standby transport vehicles 3S present in the areas E is within a predetermined range (allowable imbalance range pref) (see FIGS. 1 and 14).

Here, the areas E may be set linearly along the travelable route 1 or may be set as two-dimensional areas. FIG. 1 illustrates a mode in which twelve areas E from first to twelfth areas E1 to E12 are set. The first area E1 and the second area E2 are areas E set linearly along the second main route 4B. The third area E3 and the fourth area E4 are two-dimensional areas E set in the first main route 4A. Also, eight areas E from the fifth to twelfth areas E5 to E12 are two-dimensional areas E set to include respective sub-routes 5. Note that a transit route 9 may be included in areas E on the first main route 4A side (E3, E4), or may be included in areas E on the second main route 4B side (E1, E2). Similarly, a branch route 7 and a merge route 8 may be included in areas E on the second main route 4B side (E1, E2), or may be included in areas E on a sub-route 5 side (E5 to E6). Alternatively, a configuration is possible in which a transit route 9, a branch route 7, and a merge route 8 are not included in any of the areas E. The areas E are not required to all the same route length and area.

Figure 14:
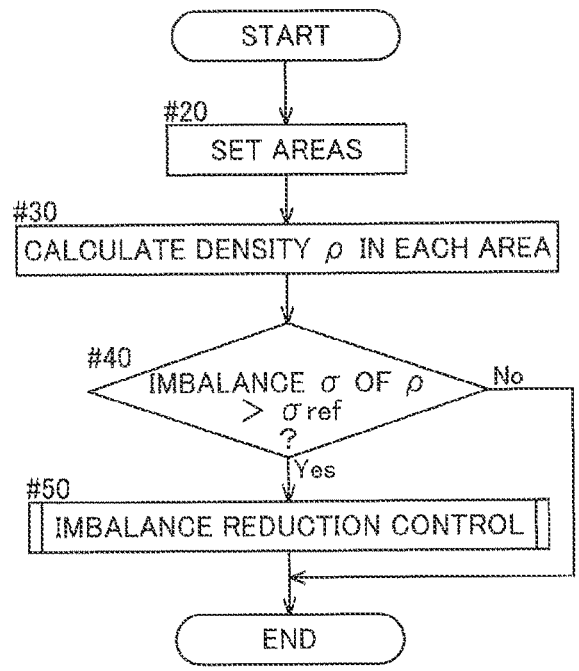
FIG. 14 is a flowchart showing an example of standby transport vehicle arrangement control, including imbalance reduction control.

As shown in the flowchart of FIG. 14, the controller H divides the entirety of the travelable route 1 into a plurality of areas E (#20). Next, the controller H calculates a density p of article transport vehicles 3 in each area E (#30). The same algorithm as that used for the above-mentioned number of vehicles value n can be used to calculate the density p. For example, for each area E, a combined link is formed by combining the links L included in the area E, the number of standby transport vehicles 3S that are present in the combined link is set as a current number of vehicles value na, and the number of standby transport vehicles 3S assigned a set route 1A that passes through the combined link is set as a future number of vehicles value nb. Note that as described above, a traveling purpose is set for each of the article transport vehicles 3. The controller H counts only the number of article transport vehicles 3 not having "transport-related traveling" as the traveling purpose (only the number of article transport vehicles 3 having "standby traveling" as the traveling purpose) when obtaining the current number of vehicles value na and the future number of vehicles value nb and calculating the number of vehicles value n. Then, the density p is calculated by dividing the number of vehicles value n in the area E by the route length, for example.

Alternatively, the counted number of standby transport vehicles 3S in the area E may include the number of standby transport vehicles 3S that are present in the area E and have not been assigned a destination (non-transport destination) in the area E, as well as the number of standby transport vehicles 3S that have been assigned a destination (non-transport destination) in the area E regardless of being or not being present in the area E. The number of standby transport vehicles 3S that are present in the area E and have not been assigned a transport destination corresponds to a portion of the current number of vehicles value na in the area E. Also, the number of standby transport vehicles 3S that have been assigned a destination (non-transport destination) in the area E regardless of being or not being present in the area E corresponds to the sum of the remaining portion of the current number of vehicles value na in the area and the future number of vehicles value nb. The controller H calculates the density p by dividing the thus-counted number of standby transport vehicles 3S (corresponding to the number of vehicles value n) in the area E by the route length.

Note that in the present embodiment, the route lengths and the areas of the areas E are not uniform, as illustrated in FIG. 1. However, the areas E may be set such that the route length of the travelable route 1 is the same in each area E. In such a case, the denominator is constant in the calculation of the density p as described above. Accordingly, the density p is equivalent to the number of standby transport vehicles 3S in each area E. Therefore, the controller H can use the number of standby transport vehicles 3S that are present in each of the areas E as the density p when executing the imbalance reduction control #50.

Next, the controller H determines whether or not the imbalance σ of the density ρ of all the areas E is within the allowable imbalance range pref (#40). For example, the determination criterion may be whether or not the standard deviation of the density ρ is less than or equal to the allowable imbalance range pref, or the determination criterion may be whether or not the difference between the highest and lowest densities ρ is less than or equal to the allowable imbalance range pref. As shown in FIG. 14, the imbalance reduction control #50 is executed if the imbalance σ of the density ρ is greater than the allowable imbalance range pref of the imbalance σ of the density ρ is not less than or equal to the allowable imbalance range pref).

In the imbalance reduction control #50, the density ρ in an area E that has a high density ρ is lowered by causing a standby transport vehicle 3S to leave that area E. The controller H determines whether or not an area E has a high density ρ based on an average density pave, for example. Here, the average density pave is the average value of the density ρ of standby transport vehicles 3S in each of a plurality of areas E. The controller H sets a first reference density Href based on the average density pave. The first reference density Href may be set by adding a predetermined first set value (may be variable) to the average density pave, or may be set by multiplying the average density pave by a predetermined first coefficient (may be variable, such as 1.2 to 2.0). In any case, the first reference density Href is set higher than the average density pave. Note that the first reference density Href may have the same value for all areas E or be set to different values.

Similarly, the controller H sets a second reference density Lref based on the average density pave. The second reference density Lref may be set by subtracting a predetermined second set value (may be variable) from the average density pave, or may be set by multiplying the average density pave by a predetermined second coefficient (may be variable, such as 0.5 to 0.8). In any case, the second reference density Lref is set lower than the average density pave. Similarly to the first reference density Href, the second reference density Lref may have the same value for all areas E or be set to different values.

Figure 15:
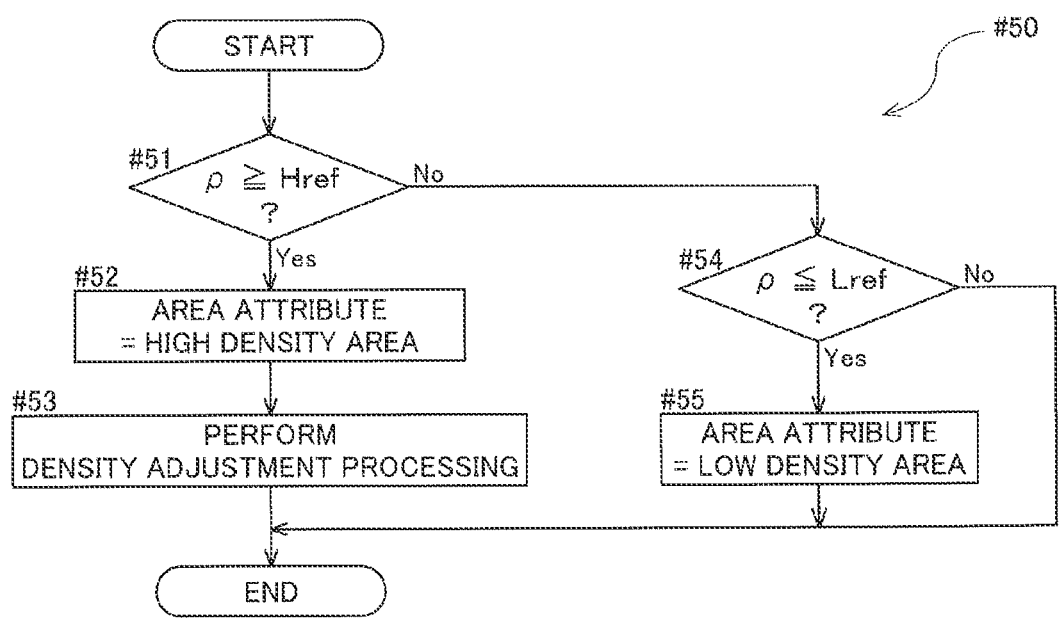
FIG. 15 is a flowchart showing an example of imbalance reduction control.

The controller H executes the imbalance reduction control #50 for each area E as shown in FIG. 15. First, the controller H determines whether the density ρ of an area E is greater than or equal to the first reference density Href (#51). If the density ρ is greater than or equal to the first reference density Href, the controller H sets an area attribute of the area E to "high density area" (#52). On the other hand, if the density ρ is less than the first reference density Href, the controller H then determines whether the density ρ of the area E is less than or equal to the second reference density Lref (#54). If the density ρ is less than or equal to the second reference density Lref, the controller H sets the area attribute of the area E to "low density area" (#55). If the density ρ is neither greater than or equal to the first reference density Href nor less than or equal to the second reference density Lref, the area attribute of the area E is set to blank (so-called null) or "average density area". In this way, the controller H determines and sets an area attribute for each area E in the process of the imbalance reduction control #50.

If it is determined in step #52 that the area E is a high density area, the controller H executes density adjustment processing #53 to move a standby transport vehicle 3S located in that area E to another area E. Specifically, letting a high density area be an area E in which the density ρ of standby transport vehicles 3S is greater than or equal to the first reference density Href, which is set higher than the average density pave, in the imbalance reduction control #50, the controller H performs the density adjustment processing #53 to move a standby transport vehicle 3S that is in the high density area to another area E. At this time, if a low density area exists, the controller H moves a standby transport vehicle 3S that is in the high density area to the low density area in the density adjustment processing #53. In other words, letting a low density area be an area E in which the density ρ of standby transport vehicles 3S is lower than or equal to the second reference density Href, which is set lower than the average density pave, in the density adjustment processing #53, if a low density area exists, the controller H moves a standby transport vehicle 3S that is in the high density area to the low density area.

If no low density area exists, the controller H moves a standby transport vehicle 3S to a selected area E in the density adjustment processing #53. At this time, for example, the standby transport vehicle 3S may be moved to the area E that has the smallest density ρ value, or the standby transport vehicle 3S may be moved to closest area E among all of the areas E. Note that it is preferable that the destination area E is not another high density area, but this does not preclude a high density area from being the destination. Since density adjustment processing is also executed in the other high density areas, the balancing of density between the areas E progresses with the passage of time.

Also, a configuration is possible in which even if a low density area exists, rather than prioritizing movement to the low density area, the controller H moves the standby transport vehicle 3S to the closest area E among all of the areas E. Also, a configuration is possible in which steps #54 and #55 in FIG. 15 are not executed, and low density area setting is not performed.

Note that many article transport vehicles 3 may be frequently dispatched to receive articles W in the fifth to twelfth areas E5 to E12 set in sub-routes 5 where a plurality of article processing apparatuses P are arranged, and in the third area E3 and the fourth area E4 set in the first main route 4A where storage units R are arranged. Of course, if a standby transport vehicle 3S is arranged near an article processing apparatus P or a storage unit R that is the destination, that standby transport vehicle 3S can arrive more quickly at the destination after receiving a transport command. For this reason, the current number of vehicles value na and the future number of vehicles value nb may be larger in the third to twelfth areas E3 to E12 than in the first area E1 and the second area E2 that are set in the second main route 4B that is simply passed through by article transport vehicles 3.

In such a case, if standby transport vehicles 3S arranged in the third to twelfth areas E3 to E12 move to another area E, the transport efficiency of the article transport facility 100 may be lowered. For this reason, it is preferable that the number of vehicles value n is allowed to be large in areas E where there are many destination points of standby transport vehicles 3S according to the transport command. For example, it is preferable that the controller H sets the first reference density Href so as to increase as the number of articles W to be received by standby transport vehicles 3S in an area E increases. Specifically, it is preferable that the first reference density Href is set so as to increase as the demand for article transport vehicles 3 (article transport vehicles 3 functioning as in-operation transport vehicles 3W) in an area E increases. Accordingly, even if the number of vehicles value n for standby transport vehicles 3S increases, the area E is unlikely to be determined to be a high density area, and is unlikely to become a target area in density adjustment processing #53. Since the standby transport vehicles 3S arranged in that area E become in-operation transport vehicles 3W, articles W can be transported quickly, and the transport efficiency of the article transport facility 100 is improved.

As described above, the number of vehicles value n includes the current number of vehicles value na and the future number of vehicles value nb. Based on a similar idea, it is preferable that the number of article transport vehicles 3 that receive an article W in an area E includes both the number of article transport vehicles 3 that have been issued a transport command and are heading to a destination, and the number of article transport vehicles 3 for which transport command issuance has been determined. For example, in the case of a destination where a transport command is to be issued, there are cases where another article transport vehicle 3 has not departed from that destination, and cases where preparation is not complete for an article W that is to be delivered at that destination. In such cases, the issuance of the transport command may be suspended until the delivery of the article W becomes possible. However, the controller H that performs transport management has generated a transport command plan, and is also aware of transport commands that are to be issued in the future. Accordingly, the number of article transport vehicles 3 for which transport command issuance has been determined can be included in the number of article transport vehicles 3 that receive an article W in an area E. Of course, the number of article transport vehicles 3 that receive an article W in an area E may include only either the number of article transport vehicles 3 that have been issued a transport command and are heading to a destination, or the number of article transport vehicles 3 for which transport command issuance has been determined.

Also, the controller H may set the first reference density Href so as to increase as the number of destination points of standby transport vehicles 3S increases according to transport commands. As described above, the controller H that performs transport management has generated a transport command plan, and is also aware of transport commands that are to be issued in the future. Accordingly, even if the issuance of a transport command has not been determined, the controller H can be aware of the planned number of standby transport vehicles 3S in each area E that is to be a destination point of a standby transport vehicle 3S according to a transport command. If the first reference density Href is set higher as the number of destinations of standby transport vehicles 3S increases according to transport commands, an area E is less likely to be determined to be a high density area in the case where a destination of a standby transport vehicle 3S is actually set in that area E. As a result, a standby transport vehicle 3S can be assigned to an area E where the demand for an article transport vehicle 3 that is to become an in-operation transport vehicle 3W is high, and the transport efficiency can be improved.

As described above, according to the present embodiment, the density ρ of standby transport vehicles 3S can be made relatively uniform among the areas E. Accordingly, it is possible to avoid the appearance of an area E having a high density ρ of standby transport vehicles 3S. By suppressing the appearance of an area E having a high density of standby transport vehicle 3S, congestion due to a high density ρ is less likely to occur, and article transport vehicles 3 in the first state (in-operation transport vehicles 3W) can travel smoothly. In other words, a standby transport vehicle 3S can travel so as not to interfere with the traveling of an article transport vehicle 3 in the first state (an in-operation transport vehicle 3W) toward a transport destination. As described above, according to the present embodiment, it is possible to provide a technique capable of reducing the likelihood that an article transport vehicle 3 not assigned a purpose of receiving an article W or delivering an article W will interfere with the traveling of an article transport vehicle 3 assigned such a purpose.

Other Embodiments

Hereinafter, other embodiments will be described. It should be noted that the configurations of the embodiments described below are not limited to being applied independently, and can be applied in combination with the configurations of other embodiments as long as no contradiction arises.

(1) As described above, in the present embodiment, drive power is supplied to the article transport vehicles 3 with use of wireless power supply technology. If one system is used to supply power over the entirety of the article transport facility 100, the amount of power loss may be high, or a voltage drop or power failure may occur over the entire area if a failure occurs in the power supply lines 20 or a power supply device (not shown) that supplies power to the power supply lines 20. For this reason, a configuration is possible in which the travelable route 1 in the article transport facility 100 is divided into a plurality of power supply areas, and power is supplied to article transport vehicles 3 in each power supply area. The controller H may control the traveling of the article transport vehicles 3 such that the number of article transport vehicles 3 in each power supply area is less than or equal to an area maximum number of vehicles set in the corresponding power supply area. The power supply areas may be the same as the areas E for managing the number of the standby transport vehicles 3S described above.

(2) In the above description, an example is described in which the position information S of the article transport vehicle 3 is position information S read based on the detection object T. However, the present invention is not limited to such a configuration. A configuration is possible in which the position information S of the article transport vehicle 3 includes information on not only the position read based on the detection object T, but also the travel distance of the article transport vehicle 3 from that position. With this configuration, the controller H can acquire a more specific position of the article transport vehicle 3. Also, if the article transport vehicle 3 includes another position detector such as GPS (Global Positioning System), the position information S acquired by the position detector may be transmitted to the controller H.

(3) In the above description, an example is described in which the article transport vehicle 3 travels on the traveling rail 2 suspended from and supported by the ceiling. However, the present invention is not limited to such a configuration. For example, a configuration is possible in which the article transport vehicle 3 travels on the traveling rail 2 disposed in a manner other than being suspended from the ceiling, such as being supported on the floor surface. Also, instead of traveling on the traveling rail 2, the article transport vehicle 3 may travel in a trackless manner, such as traveling directly on the floor surface.

Summary of Embodiments

The following describes a summary of the article transport facility described above.

In one aspect, an article transport facility according to an aspect of the present invention includes: a plurality of article transport vehicles configured to travel along a specified travelable route and transport articles; and a controller configured to control the article transport vehicles, wherein the article transport vehicles have, as operation states, a first state of traveling toward a transport destination that is a destination set for receiving an article or delivering an article, and a second state in which the transport destination has not been set, and the controller divides an entirety of the travelable route into a plurality of set areas and executes imbalance reduction control to arrange a standby transport vehicle such that imbalance of densities of standby transport vehicles present in the areas is within a predetermined range, the standby transport vehicles being article transport vehicles in the second state.

It is desirable that the standby transport vehicles travel so as not to interfere with the traveling of article transport vehicles that are in the first state and traveling toward a transport destination, but in an area where the density of standby transport vehicles is high, congestion is likely to occur due to the high density, and there is a possibility that article transport vehicles in the first state will not be able to travel smoothly. However, according to the above configuration, the densities of standby transport vehicles in the areas can be made relatively uniform. Accordingly, it is possible to avoid the appearance of an area where the density of standby transport vehicles is high, and it is possible to facilitate the smooth traveling of article transport vehicles in the first state. In other words, according to the above configuration, it is possible to provide a technique capable of reducing the likelihood that an article transport vehicle not assigned a purpose of receiving an article or delivering an article will interfere with the traveling of an article transport vehicle assigned such a purpose.

Various technical features of this article transport facility can also be applied to a transport vehicle arranging method and a transport vehicle arranging program for transport vehicle arrangement in the article transport facility, and also to a recording medium (a computer-readable recording medium) on which the transport vehicle arranging program is recorded. The following illustrates representative aspects. For example, the method for transport vehicle arrangement in an article transport facility can include various steps that have the features of the article transport facility described above. Also, a transport vehicle arranging program and a storage medium storing the transport vehicle arranging program can cause a controller, which is a computer, to realize various functions having the above-described features of the article transport facility. As a matter of course, the aforementioned transport vehicle arranging method, transport vehicle arranging program, and recording medium having the transport vehicle arranging program recorded thereon can also achieve actions and effects of the article transport facility described above. Also, as preferred embodiments of the article transport facility, various additional features illustrated in the following description of embodiments can also be incorporated into a transport vehicle arranging method, a transport vehicle arranging program, and a storage medium, and the method, the program, and the recording medium can also achieve actions and effects corresponding to the additional features.

As one preferred aspect, a transport vehicle arranging method is for, in an article transport facility that includes a plurality of article transport vehicles that travel along a specified travelable route and transport articles and a controller that controls the article transport vehicles, arrangement of the article transport vehicles by the controller, the article transport vehicles having, as operation states, a first state of traveling toward a transport destination that is a destination set for receiving an article or delivering an article, and a second state of not being assigned a purpose of receiving an article or delivering an article, and imbalance reduction control executed by the controller including: a step of dividing an entirety of the travelable route into a plurality of set areas; and a step of arranging a standby transport vehicle such that imbalance of densities of standby transport vehicles present in the areas is within a predetermined range, the standby transport vehicles being article transport vehicles in the second state.

Also, as another preferred aspect, a transport vehicle arranging program is for, in an article transport facility that includes a plurality of article transport vehicles that travel along a specified travelable route and transport articles and a controller that controls the article transport vehicles, causing the controller to realize arrangement of the article transport vehicles, the article transport vehicles having, as operation states, a first state of traveling toward a transport destination that is a destination set for receiving an article or delivering an article, and a second state of not being assigned a purpose of receiving an article or delivering an article, and the program causing the controller to realize an imbalance reduction control function including: a function of dividing an entirety of the travelable route into a plurality of set areas; and a function of arranging a standby transport vehicle such that imbalance of densities of standby transport vehicles present in the areas is within a predetermined range, the standby transport vehicles being article transport vehicles in the second state.

Also, as another preferred aspect, a storage medium has recorded thereon a transport vehicle arranging program for, in an article transport facility that includes a plurality of article transport vehicles that travel along a specified travelable route and transport articles and a controller that controls the article transport vehicles, causing the controller to realize arrangement of the article transport vehicles, the article transport vehicles having, as operation states, a first state of traveling toward a transport destination that is a destination set for receiving an article or delivering an article, and a second state of not being assigned a purpose of receiving an article or delivering an article, and the program causing the controller to realize an imbalance reduction control function including: a function of dividing an entirety of the travelable route into a plurality of set areas; and a function of arranging a standby transport vehicle such that imbalance of densities of standby transport vehicles present in the areas is within a predetermined range, the standby transport vehicles being article transport vehicles in the second state.

Here, it is preferable that in the imbalance reduction control, the controller performs density adjustment processing to cause a standby transport vehicle present in a high density area to move to another area, the high density area being an area in which the density of standby transport vehicles is greater than or equal to a first reference density that is set higher than an average density of the densities of standby transport vehicles in the areas.

According to this configuration, if there is a high density area, density adjustment control is performed to cause a standby transport vehicle to move from the high density area to another area. Even if the destination area is a high density area, density adjustment control is similarly performed in the destination high density area as well. Accordingly, standby transport vehicles ultimately move from high density areas to relatively low density areas, and the densities in the areas can be balanced.

Also, it is preferable that in the density adjustment processing, in a case where there exists a low density area that is an area in which the density of standby transport vehicles is less than or equal to a second reference density set lower than the average density, the controller causes a standby transport vehicle present in the high density area to move to the low density area.

According to this configuration, a standby transport vehicle is moved from a high density area to a low density area, and thus the densities in the areas can be balanced quickly.

Also, it is preferable that for each of the areas, the first reference density is set to increase as the number of times reception of an article is performed by a standby transport vehicle in the area increases.

According to this configuration, if a transport destination is set in an area, the destination of a standby transport vehicle present in that area or a standby transport vehicle traveling to that area is set to the transport destination, thus making it possible to quickly dispatch an article transport vehicle to a transport destination. For this reason, it is possible to shorten the waiting time for an article transport vehicle when article delivery is to be performed, and the overall transport efficiency of the article transport facility can be improved.

Also, it is preferable that for each of the areas, the number of standby transport vehicles in the area includes the number of standby transport vehicles that are present in the area and have not been assigned a destination in the area, and the number of standby transport vehicles assigned a destination in the area regardless of being or not being present in the area.

According to this configuration, the number of standby transport vehicles can be counted by combining the number of standby transport vehicles that are currently present in an area and the number of standby transport vehicles that are to be present in the area in the future. As a result, it is possible to also suppress a future increase in the density of standby transport vehicles, the densities in the areas can be balanced more quickly, and the balanced density state can also be maintained easily.

Also, it is preferable that the areas are set such that route lengths of the travelable route included in the areas are uniform, and in execution of the imbalance reduction control, for each of the areas, the controller uses the number of standby transport vehicles present in the area as the density.

According to this configuration, the route lengths of the areas are set uniformly, and thus the imbalance of the number of standby transport vehicles present in each of the areas represents the imbalance of the densities. Accordingly, the load of density calculation processing performed by the controller is reduced, and it is possible to reduce the calculation load.

What is claimed is:

1. An article transport facility comprising:
    a plurality of article transport vehicles configured to travel along a specified travelable route and transport articles; and
    a controller configured to control the article transport vehicles,
    the controller setting a set route for causing the article transport vehicle to travel from a current position to a destination on the travelable route,
    the article transport vehicles comprising, as operation states, a first state of traveling toward a transport destination that is a destination set for receiving an article or delivering an article, and a second state in which the transport destination has not been set,
    wherein the controller divides an entirety of the travelable route into a plurality of set areas and executes imbalance reduction control to arrange a standby transport vehicle such that imbalance of densities of standby transport vehicles present in the plurality of set areas is within a predetermined range, and the standby transport vehicles are the article transport vehicles in the second state.

2. The article transport facility according to claim 1, wherein in the imbalance reduction control, the controller performs density adjustment processing to cause a standby transport vehicle present in a high density area to move to another area, and the high density area is an area in which the density of standby transport vehicles is greater than or equal to a first reference density that is set higher than an average density of the densities of standby transport vehicles in the plurality of set areas.

3. The article transport facility according to claim 2, wherein in the density adjustment processing, in a case where there exists a low density area that is an area in which the density of standby transport vehicles is less than or equal to a second reference density set lower than the average density, the controller causes a standby transport vehicle present in the high density area to move to the low density area.

4. The article transport facility according to claim 2, wherein for each area of the plurality of set areas, the first reference density is set to increase as the number of times reception of an article is performed by a standby transport vehicle in the area increases.

5. The article transport facility according to claim 1, wherein for each area of the plurality of set areas, the number of standby transport vehicles in the area includes the number of standby transport vehicles that are present in the area and have not been assigned a destination in the area, and the number of standby transport vehicles assigned a destination in the area regardless of being present or not being present in the area.

6. The article transport facility according to claim 1, wherein the plurality of set areas are set such that route lengths of the travelable route included in the plurality of set areas are uniform, and
wherein in execution of the imbalance reduction control, for each area of the plurality of set areas, the controller uses the number of standby transport vehicles present in the area as the density.

7. A transport vehicle arranging method for, in an article transport facility that comprises a plurality of article transport vehicles that travel along a specified travelable route and transport articles, and a controller that sets a set route for causing the article transport vehicle to travel from a current position to a destination on the travelable route and that controls the article transport vehicles, arrangement of the article transport vehicles by the controller,
the article transport vehicles comprising, as operation states, a first state of traveling toward a transport destination that is a destination set for receiving an article or delivering an article, and a second state of not being assigned a purpose of receiving an article or delivering an article,
the method comprising:
executing, by the controller, an imbalance reduction control comprising:
dividing an entirety of the travelable route into a plurality of set areas; and
arranging a standby transport vehicle such that imbalance of densities of standby transport vehicles present in the plurality of set areas is within a predetermined range, and the standby transport vehicles are the article transport vehicles in the second state.

8. A transport vehicle arranging program product comprising at least one non-transitory computer readable storage medium including instructions for, in an article transport facility that comprises a plurality of article transport vehicles that travel along a specified travelable route and transport articles and a controller that controls the article transport vehicles, causing the controller to arrange the article transport vehicles,
the article transport vehicles comprising, as operation states, a first state of traveling toward a transport destination that is a destination set for receiving an article or delivering an article, and a second state of not being assigned a purpose of receiving an article or delivering an article, and
the transport vehicle arrangement program, when executed by at least one processor of the controller, causes the controller to perform an imbalance reduction control function comprising:
dividing an entirety of the travelable route into a plurality of set areas; and
arranging a standby transport vehicle such that imbalance of densities of standby transport vehicles present in the plurality of set areas is within a predetermined range, and the standby transport vehicles are the article transport vehicles in the second state.

9. An article transport facility comprising:
a plurality of article transport vehicles configured to travel along a specified travelable route and transport articles; and
a controller configured to control the article transport vehicles,
the article transport vehicles comprising, as operation states, a first state of traveling toward a transport destination that is a destination set for receiving an article or delivering an article, and a second state in which the transport destination has not been set,
wherein the controller divides an entirety of the travelable route into a plurality of set areas and executes imbalance reduction control to arrange a standby transport vehicle such that imbalance of densities of standby transport vehicles present in the plurality of set areas is within a predetermined range,
wherein the standby transport vehicles are the article transport vehicles in the second state, and
wherein, in the imbalance reduction control, the controller performs density adjustment processing to cause a standby transport vehicle present in a high density area to move to another area, and the high density area is an area in which the density of standby transport vehicles is greater than or equal to a density of standby transport vehicles in the plurality of set areas.

10. The article transport facility according to claim 9, wherein the high density area is an area in which the density of standby transport vehicles is greater than or equal to a first reference density that is set higher than an average density of the densities of standby transport vehicles in the plurality of set areas.

* * * * *